United States Patent
Furihata et al.

(10) Patent No.: US 7,604,835 B2
(45) Date of Patent: Oct. 20, 2009

(54) METHOD FOR MANUFACTURING WIRING SUBSTRATE AND METHOD FOR MANUFACTURING ELECTRONIC DEVICE

(75) Inventors: Hidemichi Furihata, Suwa (JP); Satoshi Kimura, Suwa (JP); Minoru Marumo, Suwa (JP)

(73) Assignee: Seiko Epson Corporation (JP)

( * ) Notice: Subject to any disclaimer, the term of this patent is extended or adjusted under 35 U.S.C. 154(b) by 714 days.

(21) Appl. No.: 11/050,252

(22) Filed: Feb. 3, 2005

(65) Prior Publication Data

US 2005/0170652 A1    Aug. 4, 2005

(30) Foreign Application Priority Data

Feb. 4, 2004   (JP) .............. 2004-028116

(51) Int. Cl.
*B05D 5/12*    (2006.01)
*B05D 3/04*    (2006.01)

(52) U.S. Cl. ............ 427/97.3; 427/98.4; 427/99.1; 427/99.5; 427/301; 427/304

(58) Field of Classification Search ........... 427/98.4, 427/99.1, 99.5, 301, 304, 97.3, 256
See application file for complete search history.

(56) References Cited

U.S. PATENT DOCUMENTS

| | | | | |
|---|---|---|---|---|
| 3,562,038 A | * | 2/1971 | Shipley | 216/18 |
| 4,668,533 A | * | 5/1987 | Miller | 427/98.5 |
| 4,682,415 A | * | 7/1987 | Adell | 29/846 |
| 4,898,468 A | * | 2/1990 | Udd | 356/483 |
| 5,021,129 A | | 6/1991 | Arbach et al. | |
| 5,114,744 A | * | 5/1992 | Cloutier et al. | 427/542 |
| 2004/0259146 A1 | * | 12/2004 | Friend et al. | 435/6 |

FOREIGN PATENT DOCUMENTS

| | | |
|---|---|---|
| JP | 3-132089 | 6/1991 |
| JP | 3-271375 | 12/1991 |
| JP | 10-065315 | * 3/1998 |
| JP | 2003-129247 | 5/2003 |

OTHER PUBLICATIONS

Examination result issued in corresponding Japanese application.

* cited by examiner

*Primary Examiner*—Brian K Talbot
(74) *Attorney, Agent, or Firm*—Harness, Dickey & Pierce, P.L.C.

(57) ABSTRACT

A method for manufacturing a wiring substrate includes the steps of (a) providing a first surface-active agent in first and second areas of a substrate, (b) providing a second surface-active agent in the first area of the substrate, (c) providing a catalyst on the second surface-active agent, and (d) depositing a metal layer on the catalyst to thereby form a wiring composed of the metal layer along the first area.

4 Claims, 5 Drawing Sheets

METHOD FOR MANUFACTURING WIRING SUBSTRATE AND METHOD FOR MANUFACTURING ELECTRONIC DEVICE

RELATED APPLICATIONS

This application claims priority to Japanese Patent Application No. 2004-028116 filed Feb. 4, 2004 which is hereby expressly incorporated by reference herein in its entirety.

BACKGROUND

1. Technical Field

The present invention relates to a method for manufacturing wiring substrates and a method for manufacturing electronic devices.

2. Related Art

A subtractive method and an additive method are known as a method for forming wirings on a flexible substrate. In the subtractive method, a metal layer is formed over the entire surface of a flexible substrate, a photoresist is formed on the metal layer by patterning, and the metal layer is etched by using the photoresist as a barrier. In the additive method, a photoresist is formed on a flexible substrate by patterning, and a metal layer is deposited by a plating process in an opening section in the photoresist.

These methods entail problems concerning consumptions of resources and raw material, in view of the fact that the photoresist is finally removed, and further in view of the fact that a part of the metal layer is removed in the subtractive method. Also, they require the steps of forming and removing a photoresist, which results in a problem of a large number of manufacturing steps. Furthermore, because the measurement accuracy of wirings depends on the resolution of a photoresist, there is a limit in forming wirings at a higher level of accuracy.

It is an object of the present invention to deposit a metal layer only in a required portion, and form wirings with a simple manufacturing process.

SUMMARY

A method for manufacturing a wiring substrate in accordance with the present invention includes the steps of:

(a) providing a first surface-active agent in first and second areas of a substrate;

(b) providing a second surface-active agent in the first area of the substrate;

(c) providing a catalyst on the second surface-active agent; and (d) depositing a metal layer on the catalyst to thereby form a wiring composed of the metal layer along the first area.

According to the present invention, the surface-active agent is formed into a two-layer structure (including a laminated or displaced configuration), such that a catalysis is selectively provided on either of the surface-active agents. By this, a metal layer can be precipitated only on a required portion along a predetermined pattern configuration. Accordingly, for example, there is no need to form a mask with a resist layer or the like, and a waste of material can be reduced, and highly accurate wirings can be formed at a low cost with a simple and short-time manufacturing process.

A method for manufacturing a wiring substrate in accordance with the present invention includes the steps of:

(a) providing a first surface-active agent in first and second areas of a substrate;

(b) providing a second surface-active agent in the first area of the substrate;

(c) providing a catalyst on the first surface-active agent; and (d) depositing a metal layer on the catalyst to thereby form a wiring composed of the metal layer along the second area.

According to the present invention, the surface-active agent is formed into a two-layer structure (including a laminated or displaced configuration), such that a catalysis is selectively provided on either of the surface-active agent layers. By this, a metal layer can be precipitated only on a required portion along a predetermined pattern configuration. Accordingly, for example, there is no need to form a mask with a resist layer or the like, and a waste of material can be reduced, and highly accurate wirings can be formed at a low cost with a simple and short-time manufacturing process.

In the method for manufacturing a wiring substrate, in the step (b), a droplet discharge method may be applied, to thereby provide the second surface-active agent in the first area. By this, the second surface-active agent can be selectively provided, and because there is no need to form a mask with a resist layer or the like, the manufacturing process is simple.

In the method for manufacturing a wiring substrate, the droplet discharge method may be an ink jet method. Accordingly, by applying the technology that has been put in practice for ink jet printers, ink (the second surface-active agent) can be economically provided at a high speed without a waste.

In the method for manufacturing a wiring substrate, in the step. (b), a print method may be applied, to thereby provide the second surface-active agent in the first area. Accordingly, the second surface-active agent can be selectively provided.

In the method for manufacturing a wiring substrate, a cationic system surface-active agent may be used as the first surface-active agent in the step (a), and an anionic system surface-active agent may be used as the second surface-active agent in the step (b). Accordingly, a potential difference can be made clearer by the first and second surface-active agents, such that the catalysis can be more securely, selectively provided.

In the method for manufacturing a wiring substrate, an anionic system surface-active agent may be used as the first surface-active agent in the step (a), and a cationic system surface-active agent may be used as the second surface-active agent in the step (b). Accordingly, a potential difference can be made clearer by the first and second surface-active agents, such that the catalysis can be more securely, selectively provided.

In the method for manufacturing a wiring substrate, in the step (c), the substrate may be dipped in a solution including tin chloride, and then dipped in a catalyst liquid including palladium chloride, to thereby deposit palladium as the catalyst.

In the method for manufacturing a wiring substrate, in the step (c), the substrate may be dipped in a catalyst liquid including tin-palladium to remove tin from the substrate, to thereby deposit palladium as the catalyst.

A method for manufacturing an electronic device in accordance with the present invention includes the method for manufacturing a wiring substrate described above, and further includes the steps of mounting a semiconductor chip having an integrated circuit on the wiring substrate, and electrically connecting the wiring substrate to a circuit substrate. According to the present invention, a waste of material can be

DETAILED DESCRIPTION

Figure 1:
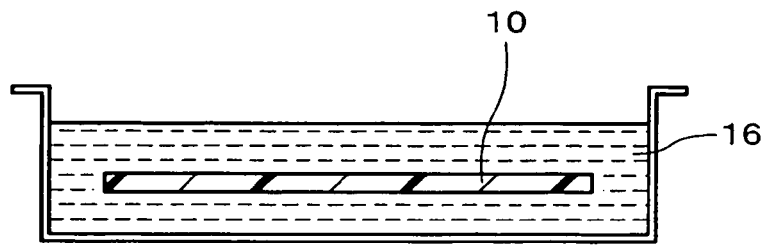
FIG. 1(A)-FIG. 1(C) are views illustrating a method for manufacturing a wiring substrate in accordance with a first embodiment of the present invention.
Figure 1:
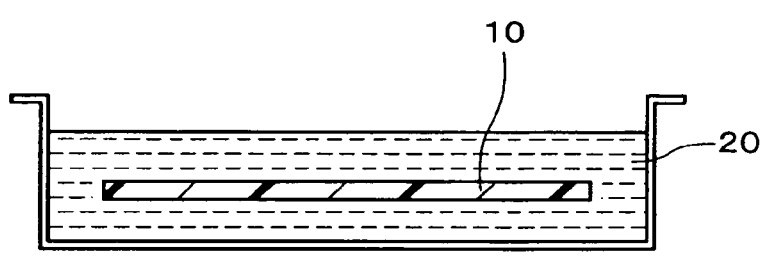
Figure 1:
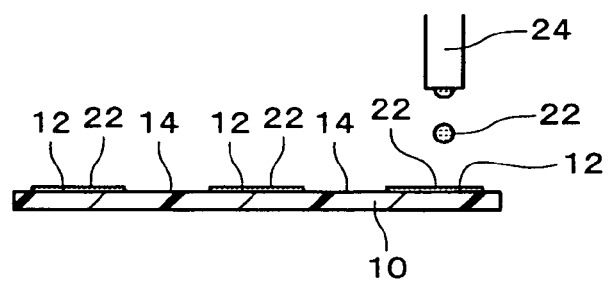
Figure 2:
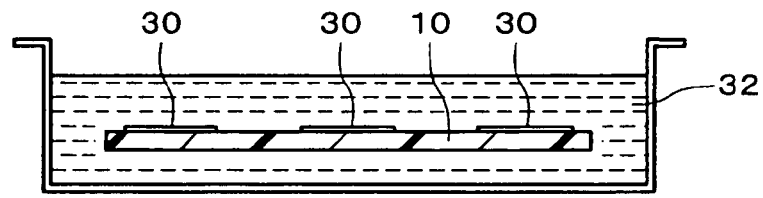
FIG. 2(A) and FIG. 2(B) are views illustrating the method for manufacturing a wiring substrate in accordance with the first embodiment of the present invention.
Figure 2:
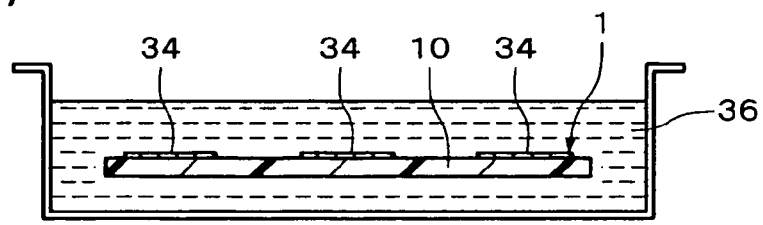

Embodiments of the present invention are described below with reference to the accompanying drawings.

First Embodiment

FIG. 1(A)-FIG. 6(B) are views illustrating a method for manufacturing a wiring substrate in accordance with an embodiment of the present invention. In the present embodiment, a wiring substrate is manufactured using an electroless plating method. FIG. 1(A)-FIG. 2(B) are views for describing steps of the electroless plating method, and FIG. 4(A)-FIG. 5(B) are views schematically illustrating a substrate in each of the steps of the electroless plating method.

A substrate (sheet) 10 may be a flexible substrate. As the flexible substrate, a FPC (Flexible Printed Circuit), a COF (Chip On Film) substrate, or a TAB (Tape Automated Bonding) substrate may be used. The substrate 10 is formed from an organic material (for example, resin). As the substrate 10, a polyimide substrate or a polyester substrate may be used. The substrate 10 has an organic interatomic bond. The substrate 10 may have at least one of a C—C, C=C, C—F, C—H, C—Cl, C—N, C—O, N—H and O—H bond. The substrate 10 may have at least a C=C bond. In the present embodiment, a wiring is formed on one of surfaces of the substrate 10. Alternatively, wirings may be formed on both of the surfaces of the substrate 10. The substrate 10 has a first area 12 and a second area 14 (see FIG. 1(C) and FIG. 4(C)). The first area 12 and the second area 14 are areas in the surface of the substrate 10 where wirings are formed.

As shown in FIG. 1(A) and FIG. 4(A), first, dirt on the surface of the substrate 10 may be washed (cleaned). As a washing method, the substrate 10 may be dipped in a washing solution 16 such as an acid, an alkali, an organic solvent or water. Concretely, a solution of hydrochloride system or an alcohol such as IPA or the like may be used as the washing solution 16. In the case of organic material, the surface potential (surface potential in a liquid) of the substrate 10 is often a negative potential. Alternatively, a substrate with its surface potential being a positive potential can be used as the substrate 10. If needed, a surface roughening treatment may be applied to the substrate 10. By conducting a cleaning treatment and a surface roughening treatment, the adhesion of a metal layer (wiring) can be improved.

As shown in FIG. 1(B) and FIG. 4(B), a first surface-active agent 18 is provided in the first and second areas 12 and 14 of the substrate 10. The surface-active agent 18 may be provided over the entire area of one of the surfaces of the substrate 10. In accordance with the present embodiment, the first surface-active agent 18 has a property to form positive ion. As the surface-active agent 18, a cationic system surface-active agent (a cation surface-active agent or one having a property equal to the same) may be used. When the surface potential of the substrate 10 is a negative potential, the negative potential on the surface of the substrate 10 can be neutralized or reversed to a positive potential by the cationic system surface-active agent used. On the other hand, when the surface potential of the substrate 10 is a positive potential, the use of the cationic system surface-active agent can improve potential nonuniformity caused by dirt or the like on the surface of the substrate 10, and form a stable positive potential surface.

In the example shown in FIG. 1(B), the substrate 10 is dipped in a surface-active agent solution 20. More specifically, the substrate is dipped in a cation surface-active agent solution of an alkyl ammonium chloride system at room temperature for about 30 seconds to three minutes, and then washed with pure water. Then, the substrate 10 is placed in a room temperature atmosphere, and is sufficiently dried.

As shown in FIG. 1(C) and FIG. 4(C), a second surface-active agent 22 is provided in the first area 12 of the substrate 10. The second surface-active agent 22 is not provided in the second area 14. The second surface-active agent 22 does not have to be adhered to the second area 14 at all in the manufacturing process. According to this, a removal step, that may be needed when the second surface-active agent 22 is adhered to the second area 14, can be omitted, such that the manufacturing process can be simplified. Also, the first surface-active agent 18 can be prevented from being removed together, which would happen if the second surface-active agent 22 were removed from the second area 14. Accordingly, the first surface-active agent 18 can be securely left, such that a potential difference can be made clearer by the first and second surface-active agents 18 and 22, as described below, and the catalyst can be more securely, selectively provided.

It is noted that the second surface-active agent 22 may be displaced from the first surface-active agent 18 (see FIG. 4(C)), or may be laminated over the first surface-active agent 18. The second surface-active agent 22 is disposed on the uppermost surface in the first area 12.

In the present embodiment, the first area 12 is an area where a metal layer (wiring) is formed, and has a predetermined pattern configuration. The second area 14 has a reversed configuration of the first area 12 in the surface of the substrate 10.

In accordance with the present embodiment, the second surface-active agent 22 has a property to form negative ion. As the second surface-active agent 22, an anionic system surface-active agent (an anion surface-active agent or one having a property equal to the same) may be used. In this case, the surface potential of the substrate 10 is made to be in a neutral state or a negative potential in the first area 12, and a positive potential in the second area 14.

In the example shown in FIG. 1(C), the second surface-active agent 22 is selectively provided by using a droplet discharge method. More specifically, droplets (of the second surface-active agent 22) are jetted from a droplet discharge section 24 directly to the surface of the substrate 10 in a predetermined pattern configuration. By this, because the second surface-active agent 22 can be selectively provided, and there is no need to form a mask with a resist layer or the like, the manufacturing process is simple. A droplet may include at least in part the second surface-active agent 22, for example, include the second surface-active agent 22 at its core, and its surface may be coated with a resin (adhesive material). Alternatively, a droplet may be formed solely from the second surface-active agent 22. The droplet discharge method may be an ink jet method, or a dispenser coating method, and is not limited as long as it has a configuration to jet droplets. According to the ink jet method, the technology that has been put in practice for ink jet printers can be applied, and ink (the second surface-active agent 22) can be economically provided at a high speed without a waste. As an ink jet head, a piezoelectric type using a piezoelectric element, a bubble jet (registered trademark) type using an electro-thermal converter as an energy generation element, or the like can be used.

Figure 3:
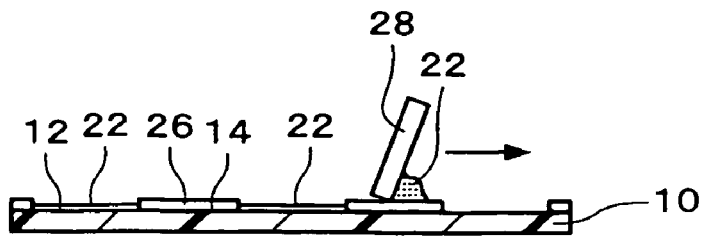
FIG. 3 is a view illustrating a method for manufacturing a wiring substrate in accordance with a modified example of the first embodiment of the present invention.
Figure 4:
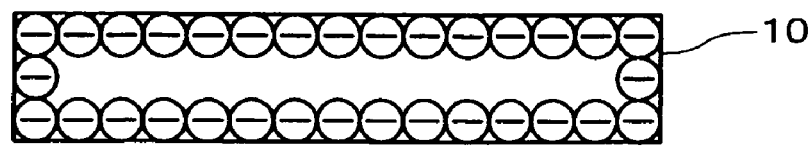
FIG. 4(A)-FIG. 4(C) are views illustrating the method for manufacturing a wiring substrate in accordance with the first embodiment of the present invention.
Figure 4:
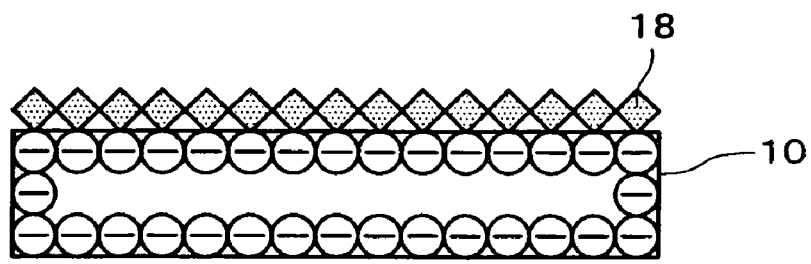
Figure 4:
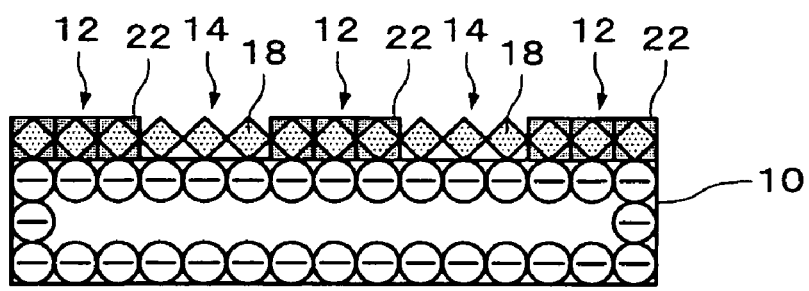

In accordance with a modified example, as shown in FIG. 3, a print method (for example, a screen print method) may be applied, whereby the second surface-active agent 22 may be selectively provided. More specifically, a mask 26 having an opening in a portion overlapping the first area 12 is disposed on the substrate 10, and ink (the second surface-active agent 22) on the mask 26 is spread by a squeegee 28, to fill the ink in the opening in the mask 26. It is noted that the means to selectively provide the second surface-active agent 22 is not limited to those described above.

Figure 5A:
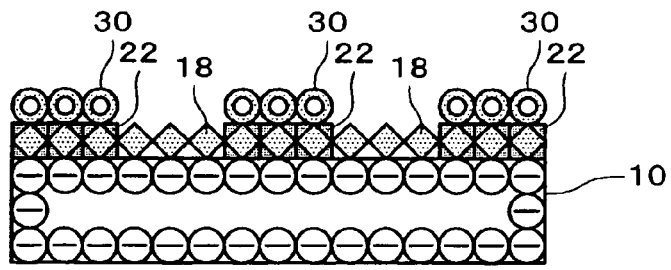
FIG. 5(A) and FIG. 5(B) are views illustrating the method for manufacturing a wiring substrate in accordance with the first embodiment of the present invention.
Figure 5:
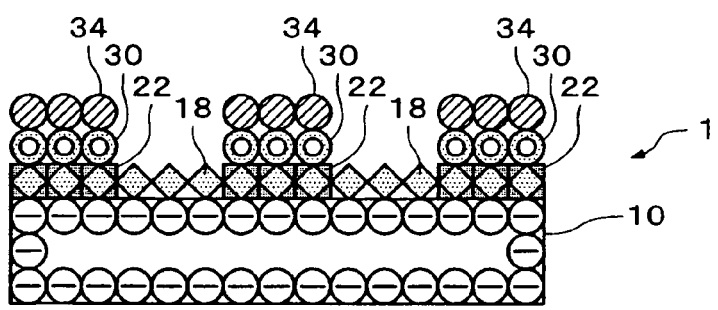
Figure 6:
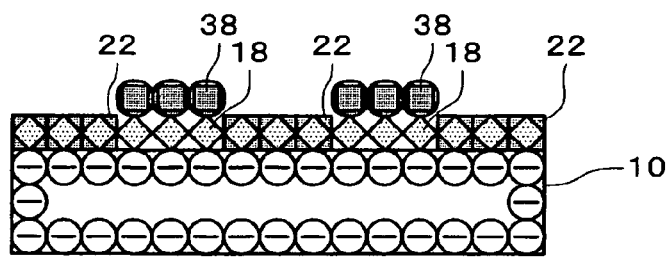
FIG. 6(A) and FIG. 6(B) are views illustrating a method for manufacturing a wiring substrate in accordance with a modified example of the first embodiment of the present invention.
Figure 6:
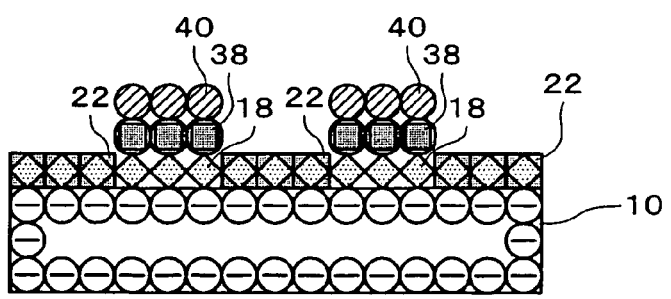

A catalyst (plating catalyst) 30 is provided on the second surface-active agent 22, as shown in FIG. 2(A) and FIG. 5(A). The catalyst 30 causes the precipitation of a metal layer (plating layer) in an electroless plating liquid, and may be, for example, palladium. A resin for bonding may not be included in the catalyst 30. The catalyst 30 is not provided on the first surface-active agent 18 (in the second area 14).

In the example shown in FIG. 2(A), the substrate 10 is dipped in a solution including tin chloride having a positive charge, and then dipped in a catalyst liquid 32 including palladium chloride. Thus, palladium can be precipitated to the second surface-active agent 22 (the anionic system surface-active agent). It is noted that the substrate 10 may be dipped in the catalyst liquid 32 for one minute-five minutes, and then washed with pure water.

As shown in FIG. 2(B) and FIG. 5(B), a metal layer 34 is deposited on the catalyst 30. Because the catalyst 30 is provided on the second surface-active agent 22, and the second surface-active agent 22 is exposed along the first area 12, the metal layer 34 can be formed in a pattern configuration along the first area 12. The metal layer 34 may be formed with one layer, or may be formed with multiple layers. The material of the metal layer 34 is not limited, and may be, for example, any one of Ni, Au, Ni+Au, Cu, Ni+Cu and Ni+Au+Cu. A catalyst may be selected according to the material of the metal layer 34 to be deposited.

In the example shown in FIG. 2(B), the substrate 10 is dipped in a plating solution 36 mainly containing nickel sulfate hexahydrate (at a temperature of 80° C.) for about one minute-three minutes, to form a nickel layer having a thickness of about 0.1-0.2 μm. Alternatively, the substrate 10 may be dipped in a plating solution mainly containing nickel chloride hexahydrate (at a temperature of 60° C.) for about three minutes-ten minutes, to form a nickel layer having a thickness of about 0.1-0.2 μm. According to the present embodiment, because the catalyst 30 is provided along the first area 12, the metal layer 34 can be selectively formed along the first area 12 of the substrate 10 even without forming a mask with a resist layer or the like.

In this manner, a wiring composed of the metal layer 334 can be formed along the first area 12. A wiring substrate in accordance with the present embodiment includes the substrate 10 and the metal layer (wiring) 34. A plurality of wirings may be formed on the substrate 10, to thereby form one wiring pattern.

According to the present embodiment, the surface-active agent is formed into a two-layer structure (including a laminated or displaced configuration), such that the catalysis 30 is selectively provided on either of the surface-active agent layers. By this, the metal layer 34 can be precipitated only to a required portion along a predetermined pattern configuration. Accordingly, for example, there is no need to form a mask with a resist layer or the like, and a waste of material can be reduced, and highly accurate wirings can be formed at a low cost with a simple and short-time manufacturing process.

FIG. 6(A) and FIG. 6(B) are views illustrating a modified example of the present embodiment. According to the present modified example, after first and second surface-active agents 18 and 22 have been provided, as indicated in FIG. 4(A)-FIG. 4(C), a catalyst 38 is provided on the first surface-active agent 18. In other words, the catalyst 38 is provided on the first surface-active agent 18 in portions exposed through the second surface-active agent 22 (portions corresponding to the second area 14 (see FIG. 4(C)). The catalyst 38 is not provided on the second surface-active agent 22 (the first area 12). In the present modified example, the second area 14 is an area where a metal layer (wiring) is formed, and has a predetermined pattern configuration.

For example, the substrate 10 is dipped in a catalyst liquid containing tin-palladium. More specifically, the substrate 10 is dipped in a tin-palladium colloid catalyst liquid of approximately PH1 for 30 seconds-three minutes at room temperature, and then sufficiently washed with clear water. Tin-palladium colloidal particle has a negative charge, and is adsorbed to the first surface-active agent 18 (cationic system surface-active agent). Then, the substrate 10 is dipped in a solution including a fluoroborate acid at room temperature for 30 seconds-three minutes for activation of the catalyst, and then washed with clear water. As a result, the tin colloidal particle is removed, and palladium alone can be precipitated on the first surface-active agent 18 (cationic system surface-active agent).

Then, as shown in FIG. 6(B), a metal layer 40 is precipitated on the catalyst 38. Because the catalyst 38 is provided on the first surface-active agent 18, and the first surface-active agent 18 is exposed along the second area 14, the metal layer 40 can be formed in a pattern configuration along the second area 14. The details described above can be applied to the method for forming the metal layer.

Figure 7:
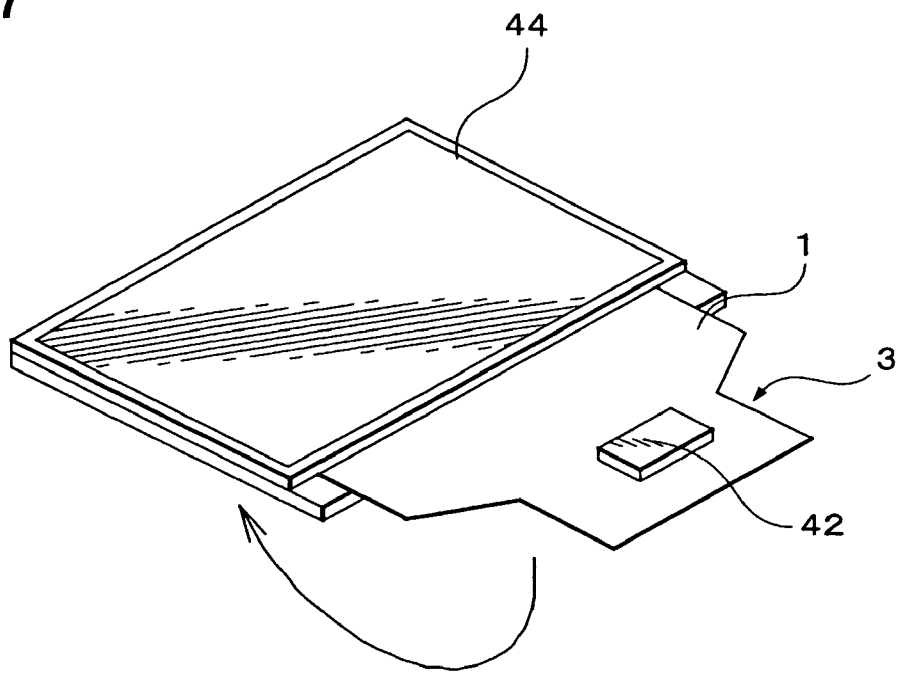
FIG. 7 is a view illustrating an electronic device in accordance with an embodiment of the present invention.
Figure 8:
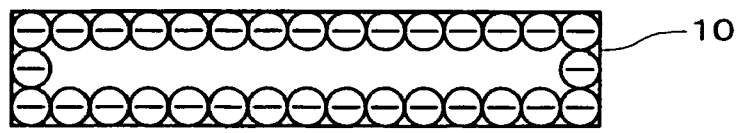
FIG. 8(A)-FIG. 8(C) are views illustrating a method for manufacturing a wiring substrate in accordance with a second embodiment of the present invention.
Figure 8:
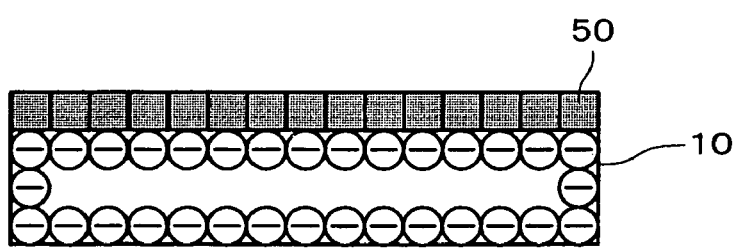
Figure 8:
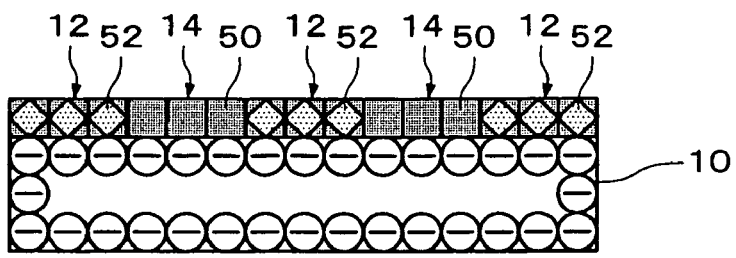
Figure 9:
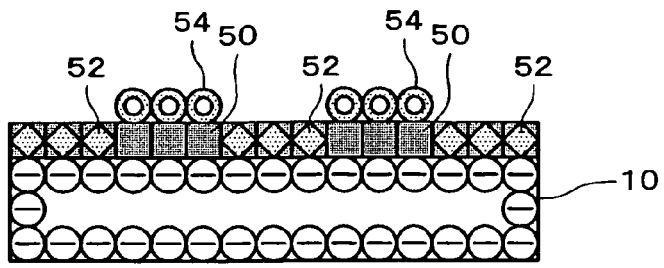
FIG. 9(A) and FIG. 9(B) are views illustrating the method for manufacturing a wiring substrate in accordance with the second embodiment of the present invention.
Figure 9:
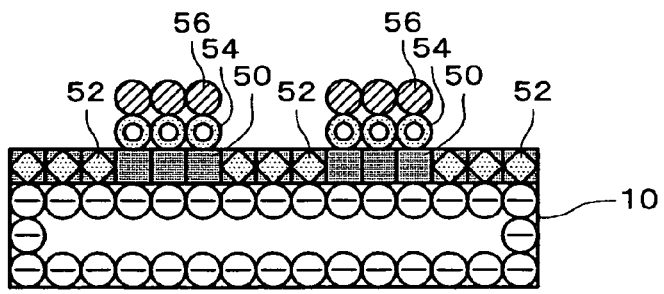
Figure 10:
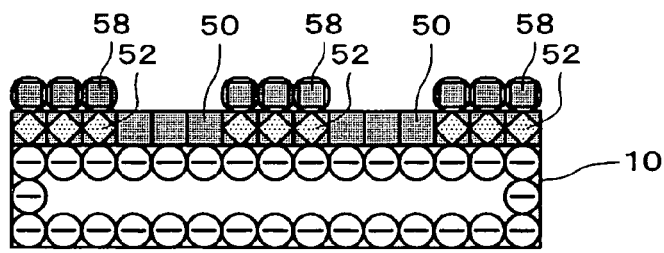
FIG. 10(A) and FIG. 10(B) are views illustrating a method for manufacturing a wiring substrate in accordance with a modified example of the second embodiment of the present invention.
Figure 10:
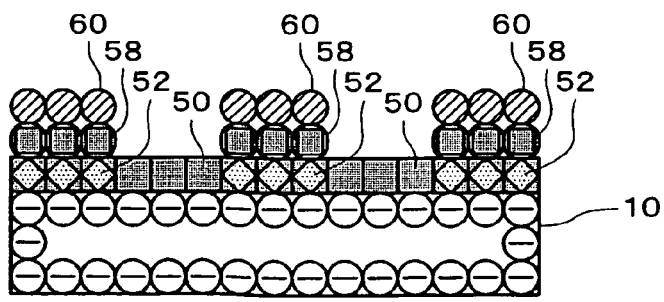

FIG. 7 is a view for describing a method for manufacturing an electronic device in accordance with an embodiment of the present invention, and more particularly, shows an example of an electronic device having a wiring substrate.

A metal layer (omitted in FIG. 7) having a predetermined pattern configuration is formed in a wiring substrate 1. A semiconductor chip 42 having an integrated circuit may be mounted (for example, face-down mounted) on the wiring substrate 1. The semiconductor chip 42 (integrated circuit) is electrically connected to the metal layer. In this manner, a semiconductor device 3 including the semiconductor chip 42 and the wiring substrate 1 may be manufactured. Then, the wiring substrate 1 (or, the semiconductor device 3) is electrically connected to a circuit board 44. Thus, the electronic device can be manufactured. It is noted that the wiring substrate 1 may be bent, as indicated by an arrow in FIG. 7.

When the circuit board 44 is an electrooptic panel, the electronic device is an electrooptic device. The electrooptic device may be a liquid crystal device, a plasma display device, an electroluminescence display device, or the like. In accordance with the present embodiment, a waste of material can be reduced, and wirings can be formed at a low cost with high accuracy, with a simple and short-time manufacturing process.

Second Embodiment

FIG. 8(A)-FIG. 10(B) are views illustrating a method for manufacturing a wiring substrate in accordance with a second embodiment of the present invention.

As shown in FIG. 8(A), a substrate 10 is prepared, and a first surface-active agent 50 is provided in first and second areas (see FIG. 8(C)) of the substrate 10 as shown in FIG. 8(B). The first surface-active agent 50 may be provided over the entire area of one of the surfaces of the substrate 10. In the present embodiment, the first surface-active agent 50 has a property to form negative ion. As the first surface-active agent 50, an anionic system surface-active agent may be used. When the surface potential of the substrate 10 is a positive potential, the positive potential of the surface of the substrate 10 can be neutralized or reversed to a negative potential by the anionic system surface-active agent used. Also, when the surface potential of the substrate 10 is a negative potential, the use of the anionic system surface-active agent can improve potential nonuniformity caused by dirt or the like on the surface of the substrate 10, and form a stable negative potential surface.

More specifically, the substrate 10 is dipped in an anion surface-active agent solution at room temperature for about 30 seconds to three minutes, and then washed with pure water. Then, the substrate 10 is sufficiently dried in a room temperature atmosphere.

As shown in FIG. 8(C), a second surface-active agent 52 is provided in the first area 12 of the substrate 10. Details of steps to provide the second surface-active agent 52 may be the same as those described above in the first embodiment, and a droplet discharge method (for example, an ink jet method) may be applied, or a print method (for example, a screen print method) may be applied. However, in accordance with the present embodiment, the second surface-active agent 52 has a property to form positive ion. As the second surface-active agent 52, a cationic system surface-active agent may be used. In this case, the surface potential of the substrate 10 is made to be in a neutral state or a positive potential in the first area 12, and a negative potential in the second area 14.

A catalyst 54 is provided on the first surface-active agent 50, as shown in FIG. 9(A). The catalyst 54 is provided on the first surface-active agent 50 in portions exposed through the second surface-active agent 52 (portions corresponding to the second area 14 (see FIG. 8(C)). The catalyst 54 is not provided on the second surface-active agent 52 (the first area 12). In the present modified example, the second area 14 is an area where a metal layer (wiring) is formed, and has a predetermined pattern configuration. To obtain the catalyst, the substrate 10 may be dipped in a solution including tin chloride, and then dipped in a catalyst liquid including palladium chloride. Details thereof are the same as those described in the first embodiment.

Then, as shown in FIG. 9(B), a metal layer 56 is precipitated to the catalyst 54. Because the catalyst 54 is provided on the first surface-active agent 50, and the first surface-active agent 50 is exposed along the second area 14, the metal layer 56 can be formed in a pattern configuration along the second area 14. Thus, a wiring composed of the metal layer 56 can be formed along the second area 14. The details described above in the first embodiment can be applied to the method for forming the metal layer.

FIG. 10(A) and FIG. 10(B) are views illustrating a modified example of the present embodiment. In the present modified example, after first and second surface-active agents 50 and 52 are provided, as indicated in FIG. 8(A)-FIG. 8(C), a catalyst 58 is provided on the second surface-active agent 52. The catalyst 58 is not provided on the first surface-active agent 50 (the second area 14). In the present modified example, the first area 112 is an area where a metal layer (wiring) is formed, and has a predetermined pattern configuration. To obtain the catalyst, the substrate 10 may be dipped in a catalyst liquid including tin-palladium. Concretely, the details described in the modified example of the first embodiment are applied.

Then, as shown in FIG. 10(B), a metal layer 60 is precipitated to the catalyst 58. Because the catalyst 58 is provided on the second surface-active agent 52, and the second surface-active agent 52 is exposed along the first area 12, the metal layer 60 can be formed in a pattern configuration along the first area 12. The details of the method for forming the metal layer described above can be similarly applied. Other details and effects of the present embodiment (including its modified examples) are the same as those described in the first embodiment.

The present invention is not limited to the embodiments described above, and many modifications can be made. For example, the present invention may include compositions that are substantially the same as the compositions described in the embodiments (for example, a composition with the same function, method and result, or a composition with the same objects and result). Also, the present invention includes compositions in which portions not essential in the compositions described in the embodiments are replaced with others. Also, the present invention includes compositions that achieve the same functions and effects or achieve the same objects of those of the compositions described in the embodiments. Furthermore, the present invention includes compositions that include publicly known technology added to the compositions described in the embodiments.

What is claimed is:

1. A method for manufacturing a wiring substrate without using a mask, the method consisting of:
   (a) providing a cationic surface-active agent in first and second areas of a substrate;
   (b) providing an anionic surface-active agent in the first areas of the substrate and on the cationic surface-active agent to form a two-layer structure of the cationic surface-active agent and the anionic surface-active agent in the first areas, the anionic surface-active agent being provided in the first areas and on the cationic surface-active agent without using the mask by an ink jet method that disposes droplets consisting of an adhesive material that coats a core of the anionic surface-active agent;

(c) providing a catalyst on either the two-layer structure of the cationic surface-active agent and the anionic surface-active agent in the first areas or on the cationic surface-active agent in the second areas, the catalyst provided on the two-layer structure being a positively charged catalyst and the catalyst provided on the cationic surface-active agent being a negatively charged catalyst; and (d) depositing a metal layer on the catalyst to thereby form a wiring composed of the metal layer along the first area.

2. A method for manufacturing a wiring substrate according to claim 1, wherein, in the step (c), the substrate is dipped in a solution including tin chloride, and then dipped in a catalyst liquid including palladium chloride, to thereby deposit palladium as the catalyst.

3. A method for manufacturing a wiring substrate according to claim 1, wherein, in the step (c), the substrate is dipped in a catalyst liquid including tin-palladium to deposit palladium as the catalyst.

4. A method for manufacturing an electronic device, comprising: the method for manufacturing a wiring substrate according to claim 1, and further comprising the steps of mounting a semiconductor chip having an integrated circuit on the wiring substrate, and electrically connecting the wiring substrate to a circuit substrate.

* * * * *